United States Patent [19]

Okada et al.

[11] Patent Number: 4,843,610
[45] Date of Patent: Jun. 27, 1989

[54] SEMICONDUCTOR LASER APPARATUS

[75] Inventors: Tsunekazu Okada; Nozomu Yamaguchi, both of Kanagawa, Japan

[73] Assignee: Sony Corporation, Tokyo, Japan

[21] Appl. No.: 198,216

[22] Filed: May 25, 1988

[30] Foreign Application Priority Data

May 27, 1987 [JP] Japan .................. 62-130368

[51] Int. Cl.⁴ .............................................. H01S 3/13
[52] U.S. Cl. ......................................... 372/31; 372/49
[58] Field of Search .................... 372/29, 31, 49, 33, 372/34; 357/19

[56] References Cited

U.S. PATENT DOCUMENTS 4,599,729 7/1986 Sasaki et al. ......................... 372/49
4,656,638 4/1987 Tihany et al. ........................ 372/49

FOREIGN PATENT DOCUMENTS 162668 11/1985 European Pat. Off. .
194835 9/1986 European Pat. Off. .
3533465 3/1986 Fed. Rep. of Germany .
2052841 1/1981 United Kingdom .

Primary Examiner—James W. Davie
Attorney, Agent, or Firm—Hill, Van Santen, Steadman & Simpson

[57] ABSTRACT

A semiconductor laser apparatus which detects a laser beam from a semiconductor laser element by using a light-receiving element so as to perform automatic light power control, the temperature characteristic of the power of a laser beam which is transmitted through an end face protection film of the semiconductor laser element and the detected power of the light-receiving element have inverse characteristics relative to each other, and variations in intensity of the output light due to changes in temperature are minimized.

4 Claims, 2 Drawing Sheets

SEMICONDUCTOR LASER APPARATUS

BACKGROUND OF THE INVENTION

1. Field of the Invention

The present invention relates to a semiconductor laser apparatus which detects the laser beam from a semiconductor laser element and uses a light-receiving element so as to perform automatic light power control.

2. Description of the Prior Art

FIG. 4 shows a semiconductor laser apparatus for automatically performing light power control. A semiconductor laser element 11 of the semiconductor laser apparatus has a first output end face 12 which emits output light and a second output end face 13 which emits light that is to be monitored.

An end face protection film 14 formed of an $Al_2O_3$ film is formed on the first output end face 12, and an end face protection film 15 consisting of an $Al_2O_3$ film 15a and an amorphous Si film 15b is formed on the second output end face 13.

A monitoring light-receiving element 16 is obliquely arranged with respect to the semiconductor laser element 11 at the side of the second output end face 13 of the element 11. A surface protective film 17 is formed on the light-receiving surface of the light-receiving element 16.

The reason why the light-receiving element 16 is obliquely arranged is to prevent the monitored light which reflected by the light-receiving element 16 from returning to the semiconductor laser element 11.

The wavelength of the laser beam emitted from the semiconductor laser element 11 has a temperature dependency of about 2.5 Å/deg, as shown in FIG. 5. When the light-receiving element 16 is obliquely arranged as described above, the reflectivity of the surface protection film 17 varies and depends on the wavelength of incident light. Therefore, the ability of the light-receiving element 16 to detect power also has a temperature dependency.

The temperature dependency of the detected power of the light-receiving element 16 may be positive or negative with respect to a change in temperature and depends on the characteristics of the individual light-receiving elements 16.

Assuming that the temperature dependency of the detected power of the light-receiving element 16 is positive with respect to a change in temperature, even if the power of the semiconductor laser element 11 is constant, the detected power of the light-receiving element 16 increases as the temperature increases, as shown by a curve 21 in FIG. 3.

The reflectivities of the end face protection films 14 and 15 of the semiconductor laser element 11 change according to the thickness of the films. FIG. 1 shows the relationship between the thickness of the $Al_2O_3$ film and the reflectivity. Note that the reflectivity when the thickness is 0 is equal to that of GaAs from which the semiconductor laser element 11 is formed.

As can be seen from FIG. 1, for example, the reflectivity shown by curve 22 becomes minimum when the film thickness is about 1,200 Å, and has an identical value for two different film thicknesses. In a conventional apparatus, in order to obtain a desired reflectivity, the thickness of the $Al_2O_3$ film is set to be less than 1,200 Å.

The reflectivity of $Al_2O_3$ also changes in accordance with the wavelength of incident light. The reflectivity 22 corresponds to incident light having a wavelength of 790 nm. A reflectivity curve 23 corresponds to incident light having a wavelength of 800 nm. For this reason, the power of the semiconductor laser element 11 on which the end face protection films 14 and 15 are formed also has a temperature dependency.

Since the end face protection film 15 includes the amorphous Si film 15b in addition to the $Al_2O_3$ film 15a in order to increase the ratio of a laser beam emitted from the first output end face 12, and hence obtain a higher reflectivity than that of the end face protection film 14, the film 15 has a smaller temperature dependency than the end face protection film 14.

Therefore, if a current is supplied to the semiconductor laser element 11 to obtain constant power output light which is emitted from the first output end face 12, the power of the monitored light emitted from the second output end face 13 has a temperature dependency with respect to the film thickness of the end face protection film 14, as shown in FIG. 2.

Since the thickness of the $Al_2O_3$ film constituting the end face protection film 14 is smaller than 1,200 Å, as described above, the temperature dependency of the power of the semiconductor laser element 11 is positive with respect to a change in temperature, as can be seen from FIG. 2.

As a result, the temperature dependency of the power of the semiconductor laser element 11 is superposed on that of the curve 21 of the light-receiving element 16 as shown in FIG. 3. Therefore, as shown in FIG. 3, a curve 24 of the semiconductor laser apparatus has a very large temperature dependency.

SUMMARY OF THE INVENTION

In a semiconductor laser apparatus according to the present invention, an end face protection film has a thickness such that the temperature dependency of the power of a laser beam transmitted through an end face protection film of the semiconductor laser element and the detected power of an output control light-receiving element have characteristics which are inverse relative to each other.

As a result, since the temperature dependency of the power of the laser beam transmitted through the end face protection film of the semiconductor laser element and of the detected power of the output control light-receiving element have inverse characteristics, the two temperature dependencies cancel each other.

In this manner, since the temperature dependencies of the power of the laser beam transmitted through the end face protection film of the semiconductor laser element and the detected power of the light-receiving element cancel each other, variations in power of output light due to changes in temperature can be minimized.

DETAILED DESCRIPTION OF THE PREFERRED EMBODIMENTS

An embodiment of the present invention will now be described with reference to FIGS. 1 to 4.

Figure 4:
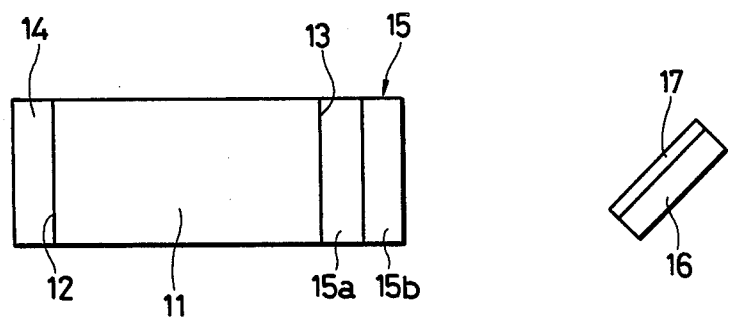
FIG. 4 is a schematic side view of a semiconductor laser apparatus.
Figure 5:
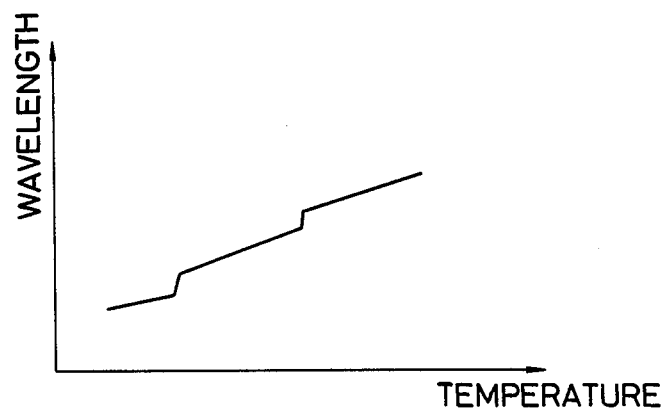
FIG. 5 is a graph showing the relationship between the wavelength of a laser beam and temperature.

A semiconductor laser apparatus of this embodiment has substantially the same arrangement as a conventional apparatus shown in FIG. 4, except that a first end face protection film 14 and a second end face $Al_2O_3$ film 15a of a semiconductor laser element 11 have the same reflectivity as the conventional apparatus but have thicknesses larger than 1,200 Å.

Figure 1:
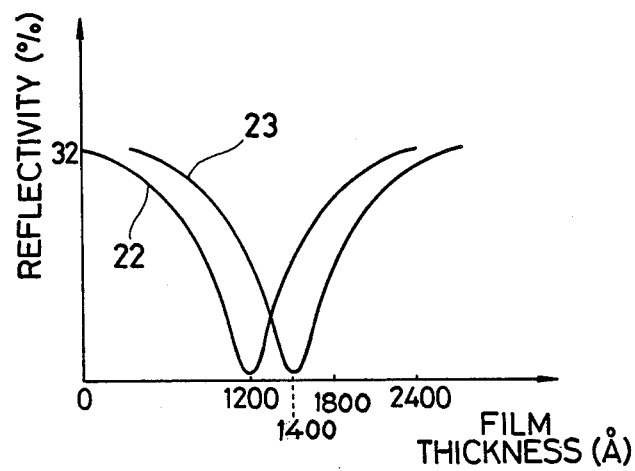
FIG. 1 is a graph showing the reflectivity of an end face protection film of a semiconductor laser element.
Figure 2:
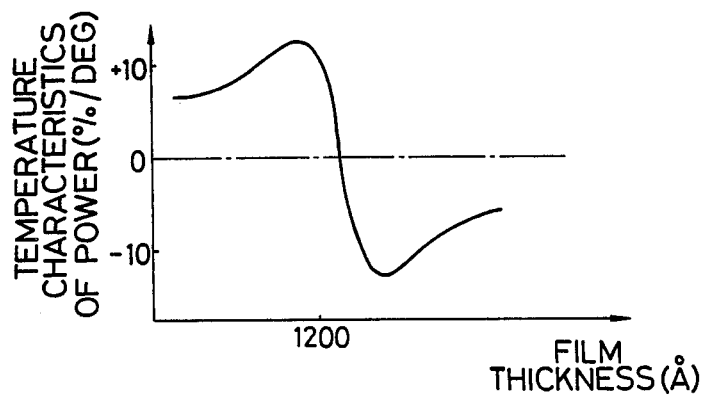
FIG. 2 is a graph showing the temperature characteristics of power of monitored light of a semiconductor laser element.

In the invention, as can be seen from FIGS. 1 and 2, the temperature dependency of the power of the semiconductor laser element 11 is negative with respect to a change in temperature. See curve 23 in FIG. 1.

Figure 3:
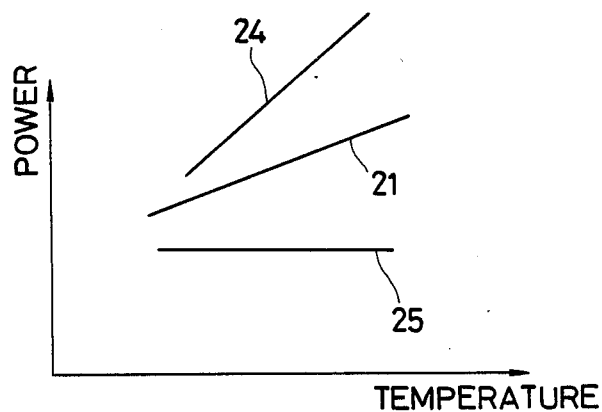
FIG. 3 is a graph showing the temperature characteristics of a semiconductor laser element and a light-receiving element.

Therefore, as shown in FIG. 3, even if the temperature dependency of the power shown by curve 21 of the light-receiving element 16 is the same as that in the conventional apparatus, the temperature dependency of the power shown by curve 21 of the light-receiving element 16 cancels that of the power of the semiconductor laser element 11.

As a result, as shown in FIG. 3, the temperature dependency of the power curve 25 of the semiconductor laser apparatus according to the embodiment is very small. Note, for example, that the curve 25 in FIG. 3 is flat which indicates that the power does not vary as the temperature changes. As is clear from FIGS. 1 and 2, if a laser which operates at a wavelength of 790 nm is selected the films 14 and 15 should have a thickness greater than 1200 Å. For example if a film of 1300 Å is utilized it will be observed in FIG. 1 that such thickness of film will have a positive reflectivity coefficient since it will be on the positive portion of curve 22. It is also to be noted that relative to FIG. 2 that when the film is greater than 1200 Å, as for example, 1300 Å that it will have a negative temperature characteristic as shown in FIG. 2 and thus, a film of 1300 Å will have a characteristic such as shown by curve 25 in FIG. 3 since the positive reflectivity characteristic of the 1300 Å film as shown in FIG. 1 is compensated by the negative film characteristic shown in FIG. 2 for a film of 1300 Å.

Although the invention has been described with respect to preferred embodiments, it is not to be so limited as changes and modifications can be made which are within the full intended scope of the invention as defined by the appended claims.

We claim as our invention:

1. A semiconductor laser apparatus comprising, a semiconductor laser element which has first and second output end faces, first and second end face protection films formed, respectively, on said first and second end faces, output light emitted as a laser beam from said first output end face, a light-receiving element for detecting the laser beam emitted from said second output end face so as to control the power of the output light, wherein said first and second end face protection films each have a thickness such that the temperature dependency of the power of the laser beam transmitted through each of said end face protection films and the temperature dependency of the detected power of said light-receiving element have characteristics which are inverse to each other.

2. A semiconductor laser apparatus according to claim 1, wherein said first end face protection film formed on said first output end face comprises an $Al_2O_3$ film, and said second end face protection film formed on said second output end face comprises two-layers of film consisting of an $Al_2O_3$ film and an amorphous Si film.

3. A semiconductor laser apparatus according to claim 2, wherein the thickness of said $Al_2O_3$ film is selected to be larger than 1,200 Å.

4. A semiconductor laser apparatus according to claim 3 wherein with a laser element which operates at about 790 nm wavelength said $Al_2O_3$ film has a thickness between 1200 and 1400 Angstroms.

* * * * *